(12) United States Patent
Kizilyalli et al.

(10) Patent No.: US 8,358,005 B2
(45) Date of Patent: Jan. 22, 2013

(54) PACKAGED GALLIUM NITRIDE MATERIAL TRANSISTORS AND METHODS ASSOCIATED WITH THE SAME

(75) Inventors: Isik C. Kizilyalli, Raleigh, NC (US);
Robert J. Therrien, Apex, NC (US);
David M. Boulin, Bethlehem, PA (US);
Apurva D. Chaudhari, Raleigh, NC (US)

(73) Assignee: International Rectifier Corporation, El Segundo, CA (US)

( * ) Notice: Subject to any disclaimer, the term of this patent is extended or adjusted under 35 U.S.C. 154(b) by 413 days.

(21) Appl. No.: 12/132,985

(22) Filed: Jun. 4, 2008

(65) Prior Publication Data

US 2009/0109646 A1    Apr. 30, 2009

Related U.S. Application Data

(60) Provisional application No. 60/933,276, filed on Jun. 4, 2007.

(51) Int. Cl.
*H01L 23/34*   (2006.01)

(52) U.S. Cl. . 257/728; 257/723; 257/724; 257/E25.016; 257/E25.029

(58) Field of Classification Search .......... 257/723–725, 257/728, E25.01, E25.012, E25.014, E25.016, 257/E25.029
See application file for complete search history.

(56) References Cited

U.S. PATENT DOCUMENTS

| 7,253,517 B2 * | 8/2007 | Heston ........................... 257/728 |
| 7,342,299 B2 * | 3/2008 | Gaucher et al. ................ 257/674 |
| 2004/0130020 A1 * | 7/2004 | Kuwabara et al. ............. 257/723 |
| 2005/0224924 A1 * | 10/2005 | Koh et al. ...................... 257/666 |
| 2010/0164091 A1 * | 7/2010 | Tsao et al. ..................... 257/692 |

\* cited by examiner

*Primary Examiner* — Matthew E Warren
(74) *Attorney, Agent, or Firm* — Farjami & Farjami LLP

(57) ABSTRACT

The invention provides semiconductor material (e.g., gallium nitride material) devices (e.g., transistors) and methods associated with the same. The devices may be supported within a package that is formed, in part, of a polymeric material. In other embodiments, the devices may be mounted to a support (e.g., circuit board) and a polymeric material may encapsulate a portion of the device extending from the support.

15 Claims, 9 Drawing Sheets

PACKAGED GALLIUM NITRIDE MATERIAL TRANSISTORS AND METHODS ASSOCIATED WITH THE SAME

RELATED APPLICATIONS

This application claims priority to U.S. Provisional Patent Application Ser. No. 60/933,276, filed Jun. 4, 2007 which is incorporated herein by reference in its entirety.

FIELD OF INVENTION

The invention relates generally to semiconductor devices and, more particularly, to packaged gallium nitride material transistors and methods associated with the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Gallium nitride materials have a number of attractive properties including high electron mobility, the ability to efficiently emit blue light, and the ability to transmit signals at high frequency, amongst others. Accordingly, gallium nitride materials are being investigated in many microelectronic applications such as transistors and optoelectronic devices.

SUMMARY OF INVENTION

Semiconductor material devices and methods associated with the same are provided.

In one aspect, a packaged semiconductor device is provided. The device comprises a package comprising a polymeric material portion and at least one transistor structure supported within the package. The transistor structure is adapted to receive an input signal and send an output signal. The device further comprises at least one matching network component separate from the transistor structure and supported within the package. The matching network component is adapted to transform an impedance of the device.

In one aspect, a packaged gallium nitride material device is provided. The device comprises a package comprising a polymeric material portion, and at least one transistor structure supported within the package. The transistor structure includes a gallium nitride material region formed on a silicon substrate, the transistor structure being adapted to receive an input signal and send an output signal.

In one aspect, a method of generating an output signal for wireless transmission is provided. The method comprises receiving an input signal to be transmitted, and amplifying the input signal via at least one transistor structure having at least one active region formed in a semiconductor material region to provide the output signal. The at least one transistor structure is supported within a package. The package comprises a polymeric material portion. At least one matching network component separate from the transistor structure is supported within the package. The matching component is adapted to transform an impedance of the device.

In one aspect, a packaged semiconductor device is provided. The device comprises a package comprising a polymeric material portion, and at least two components supported within the package. At least one of the components comprises a gallium nitride material, and at least one of the components comprises silicon.

In one aspect, a semiconductor device structure is provided. The structure comprises a semiconductor device comprising a gallium nitride material region, and a polymeric material encapsulating, at least in part, the semiconductor device.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The invention provides semiconductor material (e.g., gallium nitride material) devices (e.g., transistors) and methods associated with the same. The devices may be supported within a package that is formed, in part, of a polymeric material. In other embodiments, the devices may be mounted to a support (e.g., circuit board) and a polymeric material may encapsulate a portion of the device extending from the support. The devices may be transistors that are used in power applications to amplify an input signal to produce an output signal having increased power. As described further below, the transistors may be designed to achieve excellent electrical properties including high gain, efficiency and output power. Such properties enable the transistors to be used in RF power applications including third generation (3G) power applications based on W-CDMA modulation and wideband power applications (e.g., WiMAX, WiBRO, and others) based on OFDM modulation.

Figure 1A:
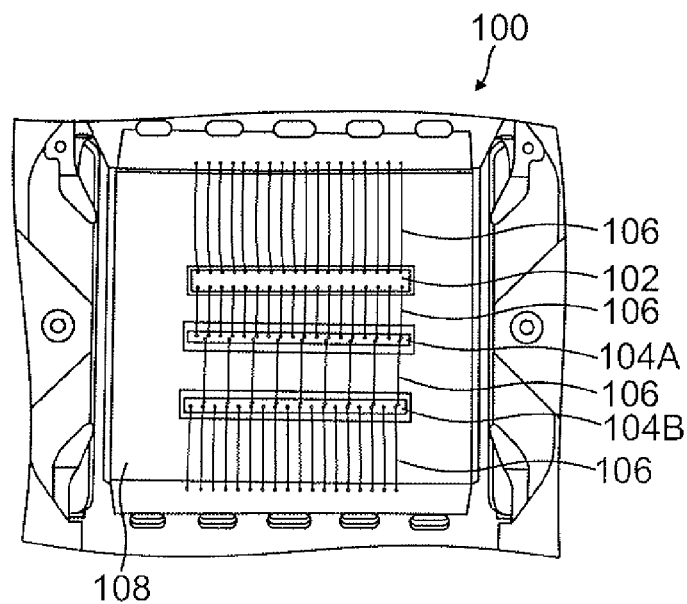
FIGS. 1A and 1B respectively illustrate a top view and a cross-section of a power transistor and associated matching network components prior to a final package assembling step according to an embodiment of the invention.

FIG. 1A is a top view of a structure 100 that includes a power transistor 102 and associated matching network components 104A and 104B prior to a final package assembling step according to an embodiment of the invention. The transistor and matching network components are mounted on a support 108 which forms part of a package as described further below. In this embodiment, the matching network component(s) are separate from the power transistor. That is, the matching network components are not on the same die (or chip) as the power transistor. Bond wires 106 may be used to make electrical connections between matching network components 104A, 104B, the power transistor and the support (as needed). In some embodiments, the bond wires may be part of the matching network.

Figure 1B:
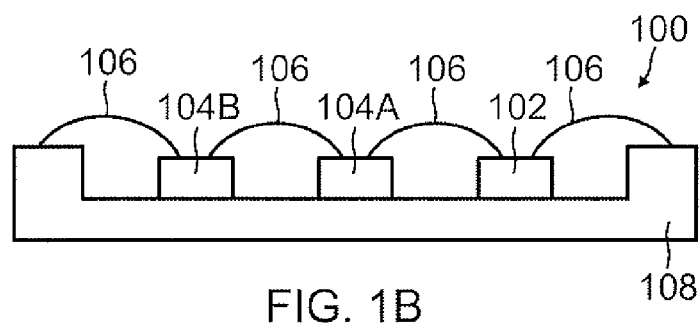
Figure 2A:
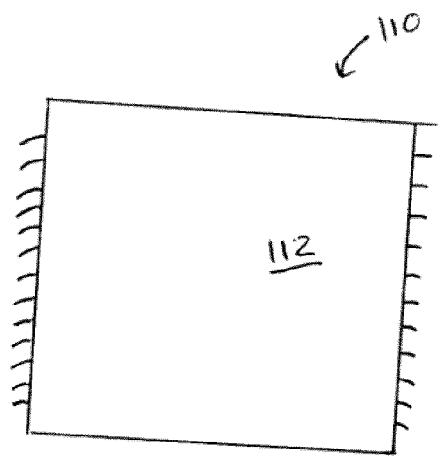
FIGS. 2A and 2B respectively illustrate a top view and a cross-section of a packaged transistor and associated matching network components according to an embodiment of the invention.

FIGS. 2A is a top view of a packaged device 110 that includes structure 100 of FIGS. 1A and 1B after a final packaging assembling. As shown, the packaged device includes a polymeric material portion 112 which couples to the support to form a package that surrounds the power transistor and associated matching network components.

Figure 2B:
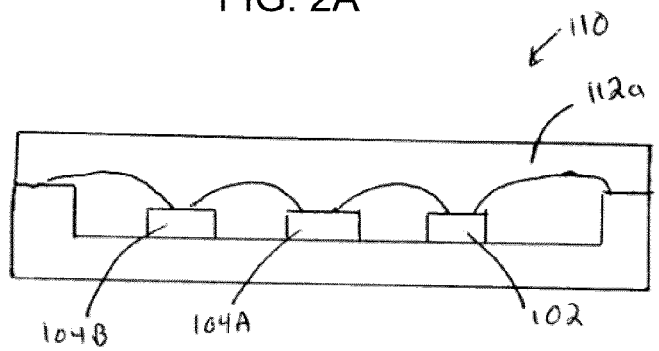

In the embodiment of FIG. 2B, polymeric material portion 112a encapsulates the power transistor and associated matching network components. In this case, polymeric material portion 112a physically contacts the power transistor, the matching network components, the bond wires and the support. For example, the encapsulating polymeric material portion 112a may be formed using an "over mold" process that involves molding the portion over the transistor and components.

Figure 2C:
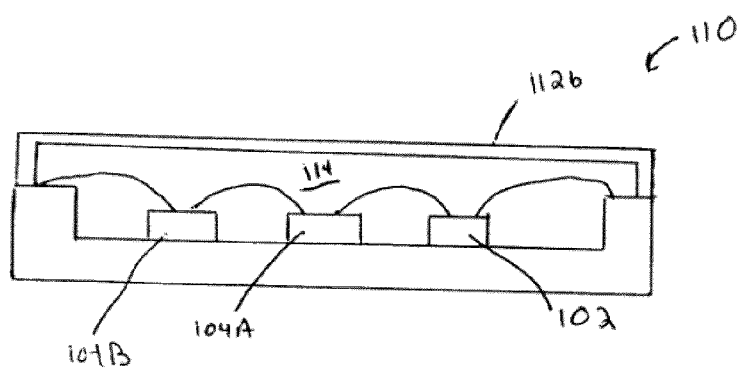
FIG. 2C is a cross-section of a packaged transistor and associated matching network components according to an embodiment of the invention.

In the embodiment of FIG. 2C, polymeric material portion 112b is a lid that attaches to the support to form a cavity 114 in which the power transistor, the matching network components and the bond wires are positioned. The lid may be attached to the support using a ring seal (not shown) which may be an organic material (e.g., a polymeric material).

Polymeric material portion 112 may be formed of any suitable polymeric material. The polymeric material may be selected to provide suitable electrical and mechanical properties. Suitable materials can include thermosets and thermoplastics. In some embodiments, the polymeric material is a polyimide. One suitable polymeric material includes PSOP2® and PSOP3® packaging materials available from Amkor Technology (www.amkor.com).

Support 108 may be formed of any suitable material. In some embodiments, the support is formed of a metal (e.g., copper) or a metal alloy (e.g., copper tungsten). In some cases, the support may be coated with a metal layer (e.g., gold). It may be preferable for the support to be thermally conductive to help dissipate heat generated by the transistor during operation. The support may be attached to a heat sink during use, to further dissipate heat.

The devices shown in FIGS. 1A-2C include an impedance matching network which transforms impedance, amongst other functions. In general, the impedance matching network may include an input matching network (e.g., formed between the input signal source and the gate pads) and/or an output matching network (e.g., formed between the drain pads and the load). The input matching network is designed to transform the input impedance of the transistor to a desired impedance (e.g., to a larger impedance to ease any subsequent external matching). The output matching network is designed to transform the output impedance of the transistor to a desired impedance (e.g., to a larger impedance to ease any subsequent external matching). For example, the transformed input and output impedance may be between 1 ohms and 50 ohms.

The matching network can comprise any component or feature capable of transforming impedance. Such components include devices (e.g., capacitors, inductors, resistors) that transform impedance by a known amount. Thus, the devices may be connected to form a network that transforms the impedance as desired.

In the embodiment shown in FIGS. 1A-2C, the devices include a first input capacitor 104A and a second input capacitor 104B. However, it should be understood that the matching network may utilize any suitable component including capacitors, inductors and resistors. Also, it should be understood that the matching network may utilize such components as input matching network components and/or as output matching network components.

Suitable capacitors that may be used in the matching network include conventional capacitor components. Suitable inductors include the bond wires. A number of variables associated with the bond wires (e.g., number, composition, dimensions, proximity to adjacent wires) may be selected to achieve the desired effect.

As shown in the illustrated embodiments, the matching network component(s) may be separate from the transistor. For example, the matching network component(s) may be discrete devices based on silicon (e.g., CMOS-based devices), while the transistor may be based on gallium nitride material (e.g., which may be formed on a silicon or a non-silicon substrate). It is also be possible to form certain components (e.g., capacitors) directly on the same semiconductor substrate as the transistor.

It should be understood that the matching network may include other components or features that transform impedance. For example, dimensions of certain transistor features (e.g., source and gate contact pads) may transform impedance and, thus, may be considered part of the matching network. In some embodiments, the bond wires may be connected to the package itself, which can make the package part of the matching network. The matching network may also include other components not described herein that transform impedance.

As noted above, the matching network is designed to transform impedance to a desired value. The matching network also may be designed to help achieve desired device performance. For example, the matching network may be designed to affect linearity (e.g., ACPR values), efficiency, gain and output power (or power density). In general, the matching network can be designed by arranging the components and features in a manner that achieves the desired result. Typically, device simulation tools and experimentation can be used to test and optimize the design.

Figure 6A:
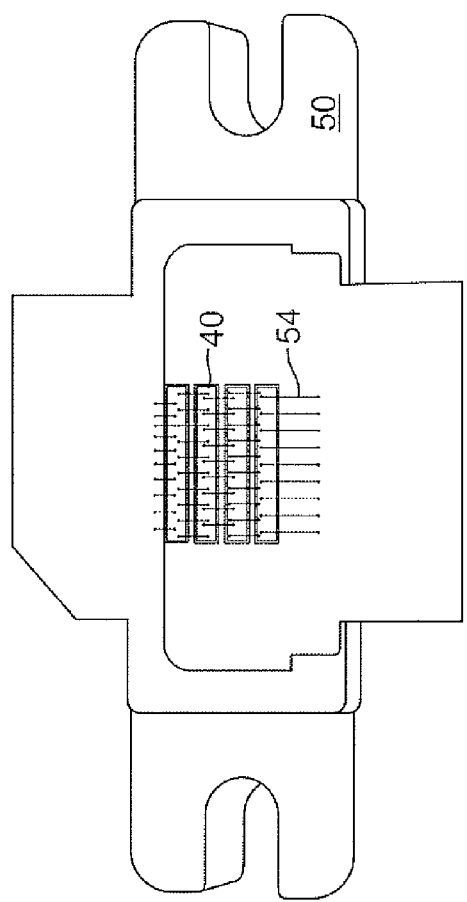
FIG. 6A is a copy of a photo of a power transistor and associated matching network prior to a final packaging step according to an embodiment of the invention.
Figure 6B:
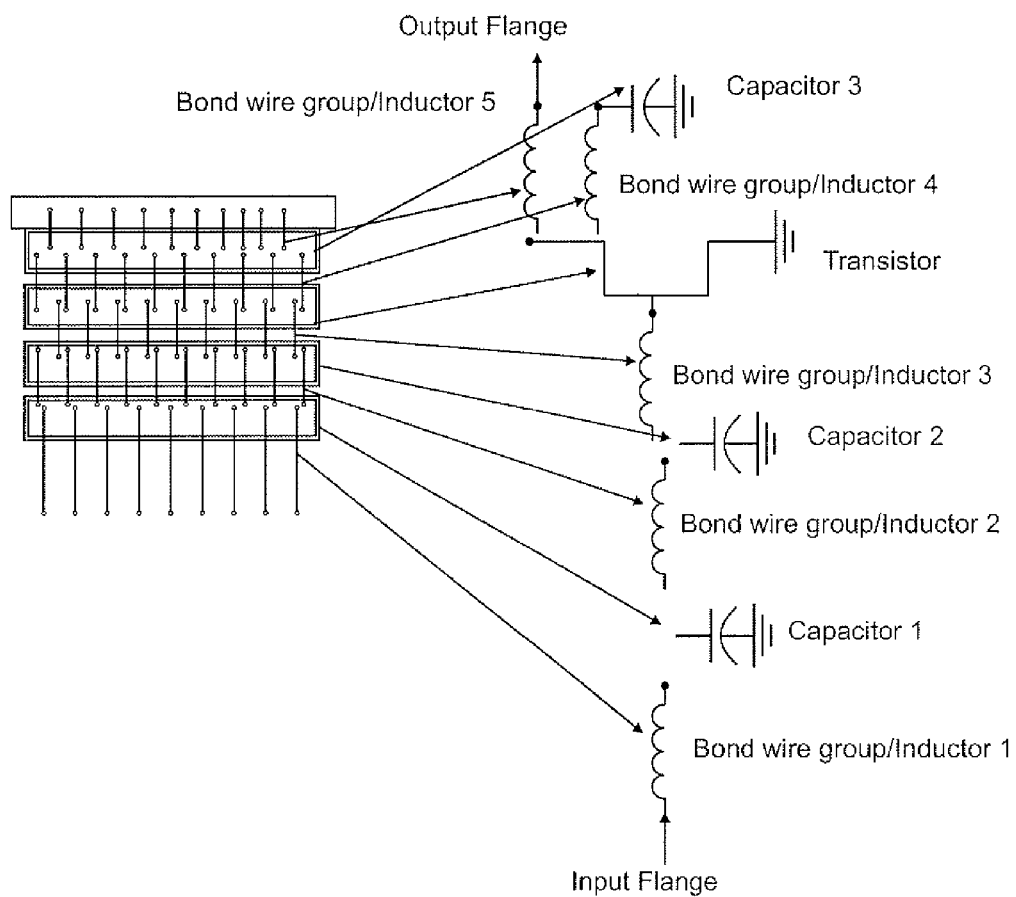
FIG. 6B shows the power transistor and matching network of FIG. 6A and the associated circuit elements.

A variety of matching network designs may be suitable. One suitable matching network is shown in the embodiment of FIGS. 6A and 6B. In this embodiment, the input matching network includes an arrangement of components positioned between a package input lead (flange) and each respective gate pad. The arrangement includes the following components as shown: inductor 1, capacitor 1, capacitor 2 and inductor 3. Inductor 1 is a bond wire group connecting the package to the first capacitor. Inductor 2 is a bond wire group connecting capacitor 1 and capacitor 2. Inductor 3 is a bond wire group connecting capacitor 2 to the transistor. Capacitors 1-2 are separate capacitor components.

The output matching network includes an arrangement of components positioned between each respective drain pad and a package output lead (flange). The arrangement includes the following components as shown: inductor 4, capacitor 3 and inductor 5. Inductor 4 is a bond wire group connecting the transistor and capacitor 3 and inductor 5 is a bond wire group connecting capacitor 3 and the output lead.

However, it should be understood that other matching networks are also suitable.

The embodiments shown in FIGS. 1A-2C illustrate a transistor. However, it should be understood that not all embodiments of the invention are limited to transistors and that other embodiments may include other types of semiconductor devices. As described further below, it may be preferable for the transistor (or other type of semiconductor device) to comprise a gallium nitride material region, though other embodiments may use devices based on other types of semiconductor materials.

Figure 3A:
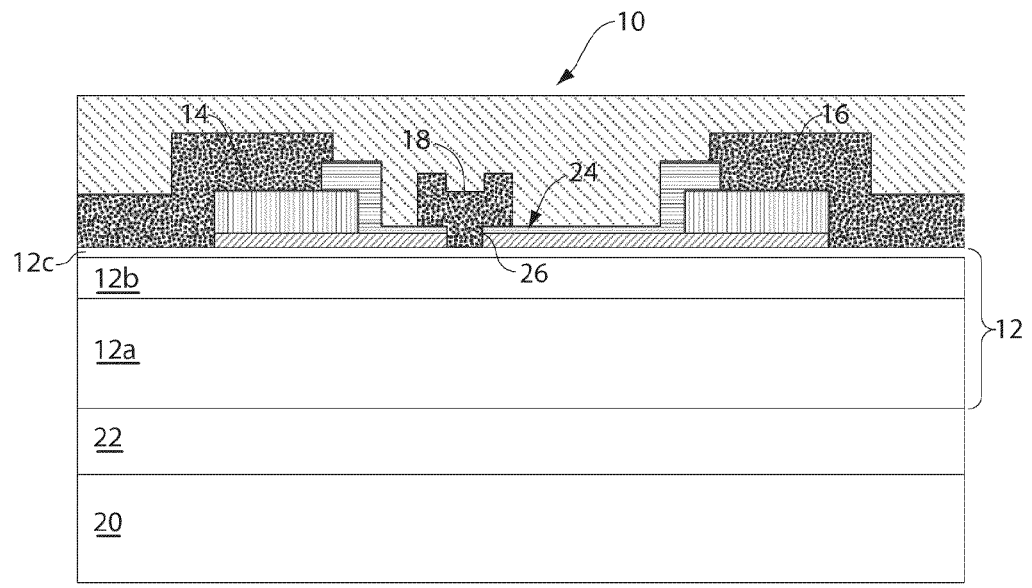
FIGS. 3A and 3B respectively illustrate a cross-section and a top view of a transistor building block structure according to an embodiment of the invention.
Figure 3B:
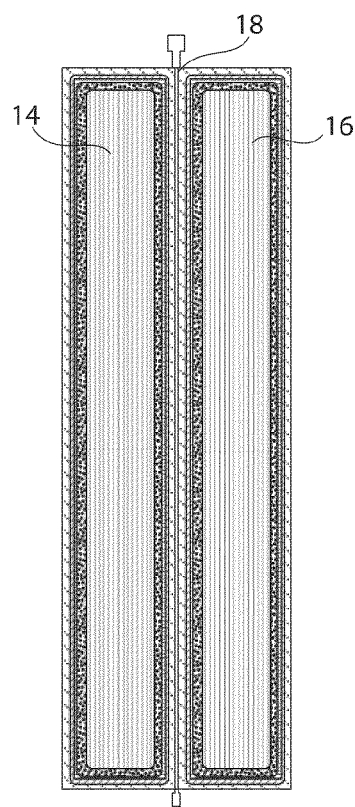

FIGS. 3A and 3B respectively illustrate a cross-section of and top view of a transistor building block structure 10 according to one embodiment of the invention. Structure 10 includes a gallium nitride material region 12. In the illustrative embodiment, the transistor structure includes a source electrode 14, a drain electrode 16 and a gate electrode 18 formed on the gallium nitride material region. The gallium nitride material region is formed on a substrate 20 and, as shown, a transition layer 22 may be formed between the substrate and the gallium nitride material region. The transistor includes a passivating layer 24 that protects and passivates the surface of the gallium nitride material region. In the illustrative embodiment, a via 26 is formed within the passivating layer in which the gate electrode is, in part, formed. As described further below, a plurality of the building block structures 10 may be combined to construct a power transistor device.

When a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate.

It should be understood that the transistor structure shown in FIGS. 3A and 3B is illustrative of an embodiment of the invention but should not be considered limiting. Other transistor structures are also within the scope of the present invention including transistor structures with different layer(s), different layer arrangements and different features. It should also be understood that though the device is described with a gallium nitride material region, other embodiments may include devices based on other semiconductor materials such as silicon.

Figure 4:
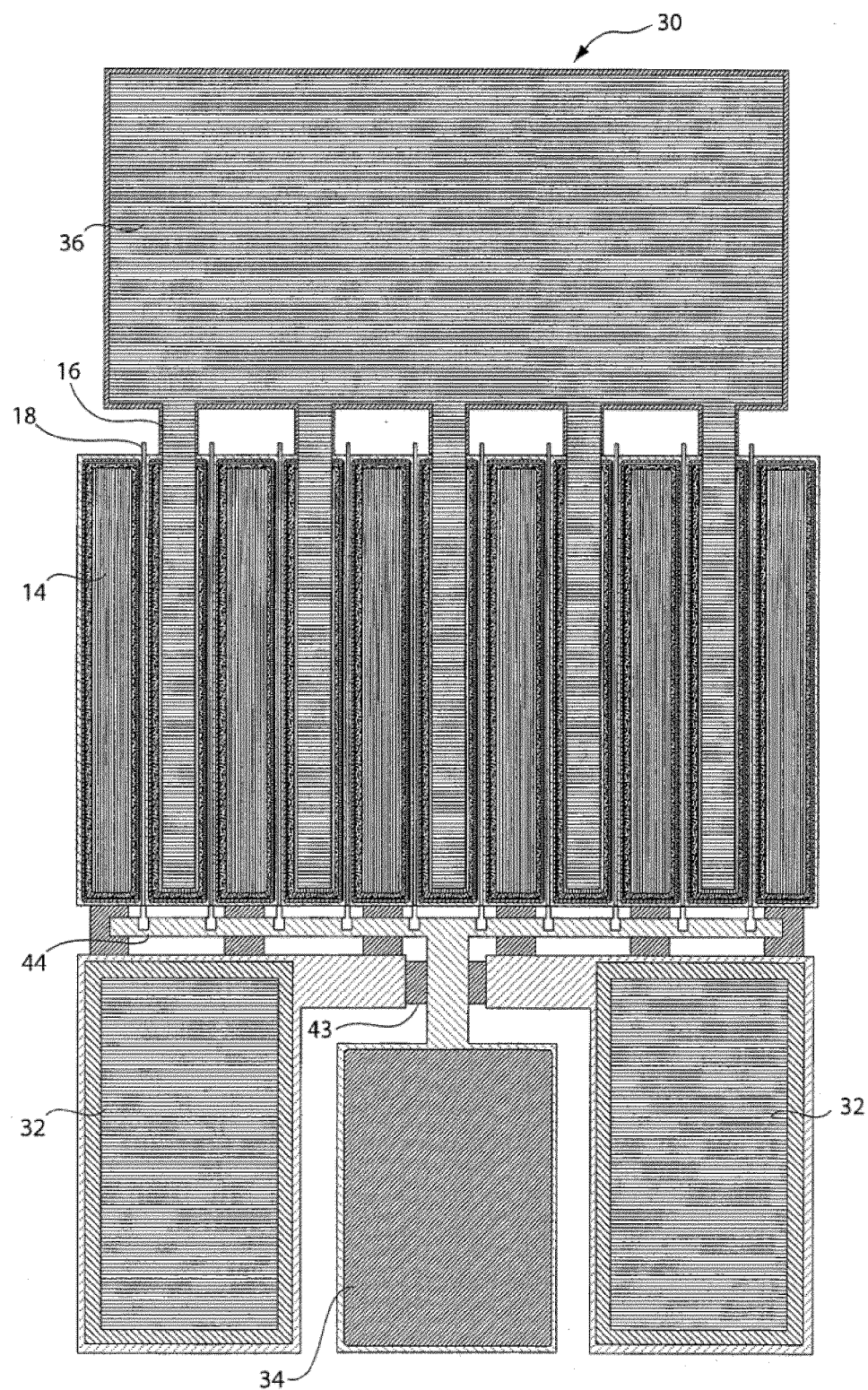
FIG. 4 is a plan view of a transistor unit cell according to an embodiment of the invention.

FIG. 4 is a plan view of a transistor unit cell 30 according to one embodiment of the invention. In this embodiment, the transistor unit cell includes ten transistor building block structures. As shown, the source electrodes in the unit cell are connected to a common source pad 32; the gate electrodes are connected to a common gate pad 34; and, the drain electrodes are connected to a common drain pad 36. In the illustrative unit cell, ten gate electrodes are connected to the gate pad, six source electrodes are connected to source pad, and five drain electrodes are connected to the gate pad.

It should be understood that, in other embodiments of the invention, the transistor unit cell may include a different number of building block structures and/or have different types of electrode and pad connections.

Figure 5:
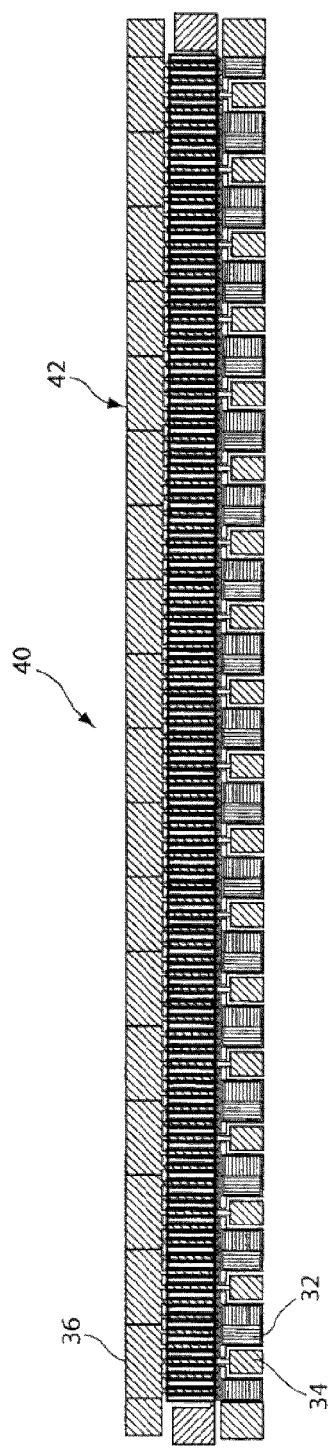
FIG. 5 is a plan view of a power transistor according to an embodiment of the invention.

FIG. 5 is a plan view of a power transistor 40 according to one embodiment of the invention. The power transistor includes multiple transistor unit cells 30 arranged in parallel. In the illustrative embodiment, the transistor includes eighteen unit cells, though other numbers of unit cells are possible. Respective drain pads 36 from the unit cells are aligned to form a drain bus 42. Respective source pads 32 are connected to a source bus 43; and, respective gate pads 34 are connected to a gate bus 44, as shown on FIG. 4.

In some embodiments, power transistor 40 is attached to a package 50 to form a final packaged device as shown in FIG. 6A. As described further above, other components (e.g., matching network components) may also be attached to the package. Bond wires 54 may be used to make electrically connections between the components, the power transistor and the package (as needed). As shown, a single power transistors may be attached to a single package. However, it should also be understood that multiple power transistors may be attached to a single package.

Figure 7:
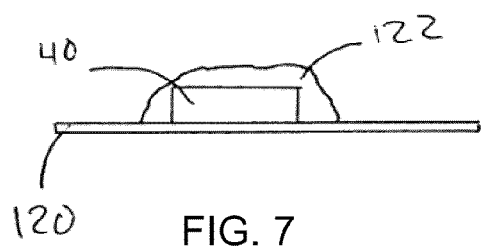
FIG. 7 is a plan view of a gallium nitride material device mounted on a circuit board with a polymeric material encapsulant.

In some embodiments, transistors 40 may not be attached to a package. Instead, the transistors may be attached directly to a circuit board, or to a heat sink. When attached to a board, other components (e.g., matching network components) may also be attached to the same board. FIG. 7 illustrates a transistor 40 attached directly to a circuit board 120. In this figure, a polymeric material 122 is used to encapsulate the transistor on the board. Any suitable polymeric material can be used including those described above in connection with polymeric material portion 112. It should be understood that other components (e.g., matching network components) may also be encapsulated on the board.

Transistors of the invention may operate in common source configuration. In this configuration, the source pads (and source electrodes) are connected to ground, the input signal from a source is received by the gate pads (and gate electrodes), and the output signal is transmitted from the drain pads (and drain electrodes) to a load driven by the transistor. However, it is possible, for the transistors to operate in other configurations.

As noted above, transistors of the invention can exhibit attractive electrical properties including high efficiencies, high output power and high gain. Suitable transistors have been described in commonly-owned U.S. Pat. No. 7,135,720 which is incorporated herein by reference.

The devices of the invention may have excellent electrical properties including high gain, efficiency, output power and linearity (ACPR). Efficiency (i.e., drain efficiency) is defined as the output power divided by the drain current multiplied by the drain voltage. Transistors of the invention may operate at efficiencies of greater than or equal to 20% (e.g., between 22% and 30%). In some embodiments, the transistors operate at efficiencies of greater than or equal to 30%; and, in some embodiments, the transistors operate at efficiencies of greater than or equal to 40%. High efficiencies may contribute to sacrificing other properties such as ACPR and output power and, thus, in some cases, efficiencies of less than 45% may be desired. The efficiency may be controlled, in part, by the matching network, operating conditions and other design features (e.g., layer composition, gate length, gate pitch, amongst others).

Output power may be measured using standard techniques. The output power depends largely on the size of the transistor. In some cases, the output power between about 0.5 W and about 150 W; or between 30 W and 150 W. In some cases, high output power devices (e.g., greater than 30 Watts) may be particularly preferred.

It may be useful to express output power in terms of power density which is the output power divided by the gate periphery (W/mm). Transistors of the invention may have power densities of greater than or equal to 0.1 W/mm. In some embodiments, the power density may be greater than or equal to 0.5 W/mm; and, in some embodiments, the power density may be greater than or equal to 1.0 W/mm. In some cases, power densities of less than or equal to 10 W/mm may be desired to limit sacrifices to other properties. The power density may be controlled, in part, by the matching network, operating conditions and other design features (e.g., layer composition, gate length, gate pitch, amongst others).

Transistors of the invention may also operate at sufficient gains for RF power transistors markets (including 3G applications). Gain is defined as the output power divided by the input power and may be expressed in units of dB. Transistors of the invention may have a gain of greater than or equal to 5 dB. In some embodiments, the gain may be greater than or equal to 12 dB (e.g., between 12 and 15). In some cases, a gain of less than or equal to 18 dB may be desired to limit sacrifices to other properties.

As noted above, bias conditions also may be used to control ACPR, efficiency and output power. As described further in Example 1, it has been discovered that operating under class AB conditions may be preferable to achieve the desired linearity (and ACPR) combined with efficiency and output power. As known to those of skill in the art, class AB operation is when the transistor is biased in such a way that current flows in the device for 51%-99% of the input signal. Class AB is between class A which operates on 100% of the input signal and class B which operates on 50% of the input signal. It may be particularly preferred to operate in deep class AB as near to maximum linear power as possible. In some embodiments, it may be preferred to operate between 51% and 75% of the input signal; in some cases, between 51% and 60% (e.g., about 55%).

Operating in class AB conditions may lead to formation of a relatively constant ACPR plateau extending over a range of each of drain efficiency, output power and power density. For example, the ACPR may vary by less than 10% over a range of 3 dB of output power, or even over a range of 5 dB or greater. Also, the ACPR may vary by less than 10% over a range of 5% efficiency, or even over a range of 10% efficiency or greater.

However, it should be understood that it may also be possible to achieve the desired linearity when operating under other classes if operation (other than AB) in some embodiments of the invention.

In some cases, the devices are operated at drain voltages of up to 300 Volts. In some cases, the drain voltage may be up to 100 Volts or up to 50 Volts (e.g., 28 Volts or 48 Volts). Suitable gate voltages may be between 0 Volts and −10 Volts.

It should also be understood that transistors of the invention may operate simultaneously at the above-noted power densities, efficiencies and gains.

The properties noted above enable transistors of the invention to be used in RF power applications. In particular, the transistors may be suitable for third generation (3G) power applications based on W-CDMA modulation and wideband power applications (e.g., WiMAX, WiBRO, and others) based on OFDM modulation. However, it should be understood, that devices of the invention may be used in other applications based on variations of W-CDMA and other modulation schemes (e.g., GSM, UMTS, EDGE, CDMA-2000, amongst others). The transistor may be based on modulation schemes including multiple carrier waves.

Referring again to FIG. 3A, gallium nitride material region 12 of the transistor structure functions as the active region. That is, the conductive channel extending from the source electrode to the drain electrode is formed in the gallium nitride material region. The gallium nitride material region comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in commonly-owned U.S. Pat. No. 6,649,287 incorporated herein by reference.

In some cases, the gallium nitride material region includes only one gallium nitride material layer. In other cases, the gallium nitride material region includes more than one gallium nitride material layer. For example, the gallium nitride material region may include multiple layers (12a, 12b, 12c), as shown. In certain embodiments, it may be preferable for the gallium nitride material of layer 12b to have an aluminum concentration that is greater than the aluminum concentration of the gallium nitride material of layer 12a. For example, the value of x in the gallium nitride material of layer 12b (with reference to any of the gallium nitride materials described above) may have a value that is between 0.05 and 1.0 greater than the value of x in the gallium nitride material of layer 12a, or between 0.05 and 0.5 greater than the value of x in the gallium nitride material of layer 12a. For example, layer 12b may be formed of $Al_{0.26}Ga_{0.74}N$, while layer 12a is formed of GaN. This difference in aluminum concentration may lead to formation of a highly conductive region at the interface of the layers 12a, 12b (i.e., a 2-D electron gas region). In the illustrative embodiment, layer 12c may be formed of GaN.

Gallium nitride material region 12 also may include one or more layers that do not have a gallium nitride material composition such as other III-V compounds or alloys, oxide layers, and metallic layers.

The gallium nitride material region is of high enough quality so as to permit the formation of devices therein. Preferably, the gallium nitride material region has a low crack level and a low defect level. As described further below, transition layer 22 (particularly when compositionally-graded) may reduce crack and/or defect formation. Gallium nitride materials having low crack levels have been described in U.S. Pat. No. 6,649,287 incorporated by reference above. In some cases, the gallium nitride material region a crack level of less than 0.005 $\mu m/\mu m^2$. In some cases, the gallium nitride material region has a very low crack level of less than 0.001 $\mu m/\mu m^2$. In certain cases, it may be preferable for gallium nitride material region to be substantially crack-free as defined by a crack level of less than 0.0001 $\mu m/\mu m^2$.

In some embodiments, gallium nitride materials having low dislocation densities may be preferred. Suitable gallium nitride materials and processes for forming the same are described in commonly-owned U.S. Patent Application Publication No. 2006/0006500 which is incorporated herein by reference and is based on co-pending U.S. patent application Ser. No. 10/886,506, filed Jul. 7, 2004.

In certain cases, the gallium nitride material region includes a layer or layers which have a monocrystalline structure. In some cases, the gallium nitride material region includes one or more layers having a Wurtzite (hexagonal) structure.

The thickness of the gallium nitride material region and the number of different layers are dictated, at least in part, by the requirements of the specific device. At a minimum, the thickness of the gallium nitride material region is sufficient to permit formation of the desired structure or device. The gallium nitride material region generally has a thickness of greater than 0.1 micron, though not always. In other cases, gallium nitride material region 12 has a thickness of greater than 0.5 micron, greater than 0.75 micron, greater than 1.0 microns, greater than 2.0 microns, or even greater than 5.0 microns.

As noted above, the device includes passivating layer 24 formed on the surface of gallium nitride material region 12. Suitable passivating layers (some of which also function as electrode-defining layers) have been described in commonly-owned U.S. Pat. No. 7,071,498, which is incorporated herein by reference.

Suitable compositions for passivating layer 24 include, but are not limited to, nitride-based compounds (e.g., silicon nitride compounds), oxide-based compounds (e.g., silicon oxide compounds), polyimides, other dielectric materials, or combinations of these compositions (e.g., silicon oxide and silicon nitride). In some cases, it may be preferable for the passivating layer to be a silicon nitride compound (e.g., $Si_3N_4$) or non-stoichiometric silicon nitride compounds.

In certain preferred embodiments, substrate 20 is a silicon substrate. Silicon substrates may be preferred because they are readily available, relatively inexpensive and are of high crystalline quality.

As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used. In some cases, silicon (111) substrates are preferred. In other cases, silicon (100) substrates are preferred.

It should be understood that other types of substrates may also be used including sapphire, silicon carbide, indium phosphide, silicon germanium, gallium arsenide, gallium nitride material, aluminum nitride, or other III-V compound substrates. However, in embodiments that do not use silicon substrates, all of the advantages associated with silicon substrates may not be achieved.

It should also be understood that though the illustrative embodiments include a substrate, other embodiments of the invention may not have a substrate. In these embodiments, the substrate may be removed during processing. In other embodiments, the substrate may also function as the gallium nitride material region. That is, the substrate and gallium nitride material region are the same region.

Substrate 20 may have any suitable dimensions and its particular dimensions are dictated, in part, by the application and the substrate type. Suitable diameters may include, but are not limited to, 2 inches (50 mm), 4 inches (100 mm), 6 inches (150 mm), and 8 inches (200 mm).

In some cases, it may be preferable for the substrate to be relatively thick, such as greater than about 125 micron (e.g., between about 125 micron and about 800 micron, or between about 400 micron and 800 micron). Relatively thick substrates may be easy to obtain, process, and can resist bending which can occur, in some cases, when using thinner substrates. In other embodiments, thinner substrates (e.g., less than 125 microns) are used. Though thinner substrates may not have the advantages associated with thicker substrates, thinner substrates can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar in the final device or structure. Substantially planar substrates may be distinguished from substrates that are textured and/or have trenches formed therein (e.g., as in U.S. Pat. No. 6,265,289). In the illustrative embodiments, the regions/layers formed on the substrate (e.g., transition layer, gallium nitride material region, and the like) may also be substantially planar. As described further below, such regions/layers may be grown in vertical (e.g., non-lateral) growth processes. Planar substrates and regions/layers can be advantageous in some embodiments, for example, to simplify processing. Though it should be understood that, in some embodiments of the invention, lateral growth processes may be used as described further below.

Transition layer 22 may be formed on substrate 20 prior to the deposition of gallium nitride material region 12. The transition layer may accomplish one or more of the following: reducing crack formation in the gallium nitride material region 12 by lowering thermal stresses arising from differences between the thermal expansion rates of gallium nitride materials and the substrate; reducing defect formation in gallium nitride material region by lowering lattice stresses arising from differences between the lattice constants of gallium nitride materials and the substrate; and, increasing conduction between the substrate and gallium nitride material region by reducing differences between the band gaps of substrate and gallium nitride materials. The presence of the transition layer may be particularly preferred when utilizing silicon substrates because of the large differences in thermal expansion rates and lattice constant between gallium nitride materials and silicon. It should be understood that the transition layer also may be formed between the substrate and gallium nitride material region for a variety of other reasons. In some cases, for example when a silicon substrate is not used, the device may not include a transition layer.

The composition of transition layer 22 depends, at least in part, on the type of substrate and the composition of gallium nitride material region 12. In some embodiments which utilize a silicon substrate, the transition layer may preferably comprise a compositionally-graded transition layer having a composition that is varied across at least a portion of the layer. Suitable compositionally-graded transition layers, for example, have been described in commonly-owned U.S. Pat. No. 6,649,287, entitled "Gallium Nitride Materials and Methods," filed on Dec. 14, 2000, which is incorporated herein by reference. Compositionally-graded transition layers are particularly effective in reducing crack formation in the gallium nitride material region by lowering thermal stresses that result from differences in thermal expansion rates between the gallium nitride material and the substrate (e.g., silicon). In some embodiments, when the compositionally-graded, transition layer is formed of an alloy of gallium nitride such as $Al_xIn_yGa_{(1-x-y)}N$, $Al_xGa_{(1-x)}N$, or $In_yGa_{(1-y)}N$, wherein $0 \leq x \leq 1$, $0 \leq y \leq 1$. In these embodiments, the concentration of at least one of the elements (e.g., Ga, Al, In) of the alloy is typically varied across at least a portion of the cross-sectional thickness of the layer. For example; when the transition layer has an $Al_xIn_yGa_{(1-x-y)}N$ composition, x and/or y may be varied; when the transition layer has a $Al_xGa_{(1-x)}N$ composition, x may be varied; and, when the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within the gallium nitride material region. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer). The composition of the transition layer, for example, may be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region.

In some cases, the transition layer has a monocrystalline structure.

It should be understood that, in some embodiments, transition layer 22 has a constant (i.e., non-varying) composition across its thickness.

The source, drain and gate electrodes may be formed of any suitable conductive material such as metals (e.g., Au, Ni, Pt), metal compounds (e.g., WSi, WSiN), alloys, semiconductors, polysilicon, nitrides, or combinations of these materials. In particular, the dimensions of the gate electrode can be important to device performance. In the illustrative embodiment, via 26 formed in the passivating layer defines (at least in part) the gate electrode dimensions. Thus, by controlling the shape of the via, it is possible to define desired gate dimensions. Suitable via and gate dimensions have been described in commonly-owned U.S. Pat. No. 7,071,498, incorporated by reference.

In some embodiments, electrodes may extend into the gallium nitride material region. For example, electrode material (e.g., metal) deposited on the surface of the gallium nitride material region may diffuse into the gallium nitride material region during a subsequent annealing step (e.g., RTA) when forming the electrode. In particular, the source and drain electrodes may include such a portion diffused into the gallium nitride material region. As used herein, such electrodes are still considered to be formed on the gallium nitride material region.

Source, gate and drain pads may be formed of any suitable conductive material such as metals (e.g., Au, Ni, Pt), metal compounds (e.g., WSi, WSiN), alloys, semiconductors, polysilicon, nitrides, or combinations of these materials. In some embodiments, the pads are formed of the same material as the corresponding electrodes.

The device shown in FIGS. 1A and 1B also includes an encapsulation layer 36 which, as known to those of skill in the art, encapsulates underlying layers of the structure to provide chemical and/or electrical protection. The encapsulation layer may be formed of any suitable material including oxides or nitrides.

It should be understood that the transistor structure may include other layers. For example, the transistor structure may include additional features not shown in FIGS. 1A and 1B. For example, the transistor structure may include a strain-absorbing layer formed directly on the surface of substrate 20. Suitable strain-absorbing layers have been described in commonly-owned, co-pending U.S. patent application Ser. No. 10/879,703, entitled "Gallium Nitride Materials and Methods Associated With the Same", filed Jun. 28, 2004, which is incorporated herein by reference. In one embodiment, it may be preferable for the strain-absorbing layer to be very thin (e.g., thickness of between about 10 Angstroms and about 100 Angstroms) and formed of an amorphous silicon nitride-based material.

In some embodiments, other layers (e.g., intermediate layers) may be present. Suitable intermediate layers, for example, have been described and illustrated in U.S. Pat. No. 6,649,287, which was incorporated by reference above. In other embodiments of the invention, layer(s) shown herein may not be present. Other variations to the structures and devices shown herein would be known to those of skill in the art and are encompassed by the present invention.

Structures and devices of the present invention may be formed using methods that employ conventional processing techniques. In general the stack of material layers is formed on a substrate which is later processed (e.g., diced) to form the desired final structure (e.g., transistor).

For example, the layers and regions of the transistor structure of FIGS. 1A and 1B may be formed, patterned, etched and implanted using conventional techniques.

Transition layer 22 and gallium nitride material region 12 may be deposited, for example, using metal organic chemical vapor deposition (MOCVD), molecular beam epitaxy (MBE), and hydride vapor phase epitaxy (HVPE), amongst other techniques. The preferred technique may depend, in part, on the composition of the layers. An MOCVD process may be preferred. A suitable MOCVD process to form a transition layer (e.g., a compositionally-graded transition layer) and gallium nitride material region over a silicon substrate has been described in U.S. Pat. No. 6,649,287 incorporated by reference above. When the semiconductor material region has different layers, in some cases it is preferable to use a single deposition step (e.g., an MOCVD step) to form the entire gallium nitride material region. When using the single deposition step, the processing parameters are suitably changed at the appropriate time to form the different layers. In certain preferred cases, a single growth step may be used to form the transition layer and the gallium nitride material region.

When present, the stress-absorbing layer may be formed using techniques described in U.S. patent application Ser. No., 10/879,703 which is incorporated by reference above.

Passivating layer 24 may be deposited using any suitable technique. The technique used, in part, depends on the composition of the passivating layer. Suitable techniques include, but are not limited to CVD, PECVD, LP-CVD, ECR-CVD, ICP-CVD, evaporation and sputtering. When the passivating layer is formed of a silicon nitride material, it may be preferable to use PECVD to deposit the layer.

When present, via 26 may be formed within the passivating layer using an etching technique. A plasma etching technique is preferably used to form the via with controlled dimensions Source, drain and gate electrodes may be deposited on the gallium nitride material region using known techniques such as an evaporation technique. In cases when the electrodes include two metals, then the metals are typically deposited in successive steps. The deposited metal layer may be patterned using conventional methods to form the electrodes. In some embodiments, an annealing step (e.g., RTA) may also be used in which the deposited electrode material diffuses into the gallium nitride material region, particularly when forming source and drain electrodes.

Suitable techniques for forming the passivating layer, via and electrodes have been described in commonly owned, co-pending U.S. patent application Ser. No. 10/740,376, which is incorporated herein by reference above.

Source, drain and gate electrode pads may also be deposited and patterned using known techniques.

In some embodiments, an isolation region may be formed which electrically isolates the active region. Suitable processes for forming an isolation region have been described in commonly owned, co-pending U.S. patent application Ser. No. 10/879,795, filed Jun. 28, 2004, entitled "Gallium Nitride Material Structures Including Isolation Regions and Methods", which is incorporated herein by reference above.

The above-described processes are used to form a semiconductor wafer including the desired material layers and features. The wafer may be further processed using conventional techniques to produced the desired structure. In some methods, the wafer may be thinned from its backside. A metallic layer (e.g., gold) may then be deposited on the backside. The wafer may be diced to form transistors (e.g., die) which can be further processed. When mounting on a package, the transistor may be placed in the package and subjected to a heating step sufficient to weld the transistor to the packaging material. In other embodiments, the transistors are mounted to other entities (e.g., a heat sink) using known techniques.

It should be understood that the invention encompasses other methods than those specifically described herein. Also, variations to the methods described above would be known to those of ordinary skill in the art and are within the scope of the invention.

The following examples are not limiting and are presented for purposes of illustration.

EXAMPLE 1

The following example illustrates the characterization of the performance of a packaged gallium nitride transistor.

Figure 8:
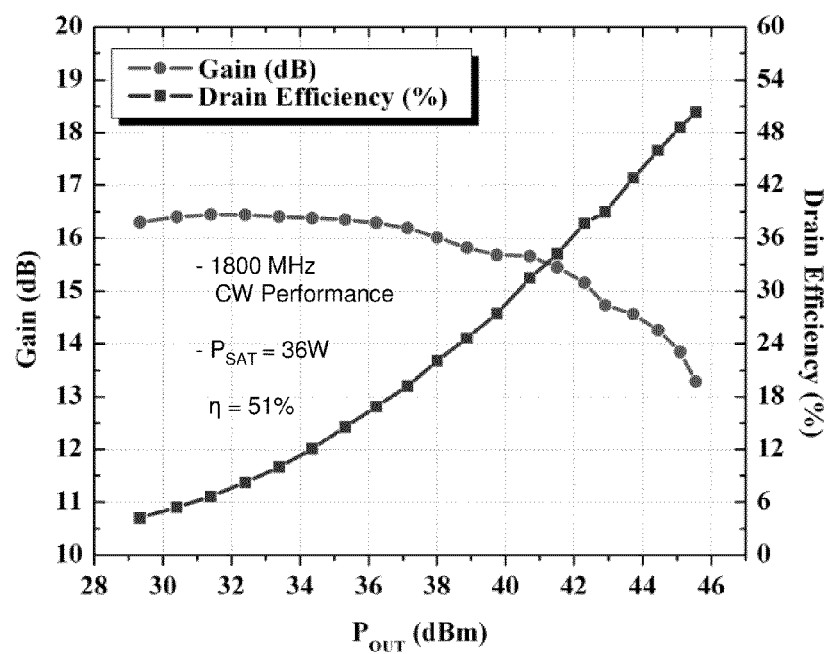
FIG. 8 shows drain efficiency and gain as a function of output power for a transistor of the invention as described in Example 1.

A packaged transistor including a power transistor and matching network components similar to those illustrated in FIG. 1A was manufactured and characterized. The power transistor was formed of structures similar to those illustrated in FIGS. 3A-5. The device included a PSOP3® package material available from Amkor Technology (www.amkor.com). FIG. 8 shows gain and drain efficiency as a function of output power.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

The invention claimed is:

1. A packaged semiconductor device comprising:
a package comprising a polymeric material portion;
at least two components each mounted directly on a support of said package, at least one of the components comprising a gallium nitride material and at least one of the components comprising silicon;
at least one of said at least two components comprising a matching network component that is adapted to transform an impedance of said packaged semiconductor device and forms a part of an impedance matching network;
at least one bond wire connecting a top surface of said at least one of the components comprising a gallium nitride material to a top surface of said at least one of the components comprising silicon.

2. The packaged semiconductor device of claim 1, wherein one component comprises gallium nitride material and silicon with the gallium nitride material being a region formed over a silicon substrate.

3. The packaged semiconductor device of claim 1, wherein said at least one component comprising gallium nitride is a transistor and said at least one component comprising silicon comprises said matching network component.

4. The packaged semiconductor device of claim 1, wherein said polymeric material portion comprises a polyimide.

5. The packaged semiconductor device of claim 1, wherein said polymeric material portion encapsulates said at least two components so as to physically contact at least one of said at least two components.

6. The packaged semiconductor device of claim 1, wherein said support of said package is configured for attachment to a heatsink during use of said packaged semiconductor device.

7. The packaged semiconductor device of claim 1, wherein said at least one component comprising gallium nitride comprises a power semiconductor device.

8. The packaged semiconductor device of claim 1, wherein said at least one component comprising gallium nitride comprises a power semiconductor device configured for radio-frequency (RF) operation.

9. The packaged semiconductor device of claim 1, wherein said at least one component comprising gallium nitride comprises a heterojunction device configured to produce a 2-dimensional electron gas (2DEG).

10. The packaged semiconductor device of claim 1, wherein said at least one component comprising gallium nitride comprises a heterojunction field-effect transistor (HFET).

11. The packaged semiconductor device of claim 1, wherein said at least one component comprising silicon comprises a complimentary metal-oxide-semiconductor (CMOS) component.

12. The packaged semiconductor device of claim 1, wherein said at least one component comprising silicon comprises an impedance matching network component.

13. The packaged semiconductor device of claim 12, wherein said at least one component comprising silicon is implemented to provide input impedance matching for said at least one component comprising gallium nitride.

14. The packaged semiconductor device of claim 13, further comprising another component comprising silicon implemented to provide output impedance matching for said at least one component comprising gallium nitride.

15. The packaged semiconductor device of claim 1, wherein said at least one component comprising silicon comprises a capacitor.

* * * * *